(12) United States Patent
Melanson

(10) Patent No.: US 6,373,334 B1
(45) Date of Patent: Apr. 16, 2002

(54) REAL TIME CORRECTION OF A DIGITAL PWM AMPLIFIER

(75) Inventor: John Laurence Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/592,145

(22) Filed: Jun. 12, 2000

(51) Int. Cl.[7] .................................................. H03F 3/38

(52) U.S. Cl. ....................... 330/10; 330/207 A; 330/251

(58) Field of Search ............................... 330/10, 207 A, 330/251

(56) References Cited

U.S. PATENT DOCUMENTS

| | | | |
|---|---|---|---|
| 5,548,286 A | | 8/1996 | Craven ........................ 341/126 |
| 5,777,512 A | * | 7/1998 | Tripathi et al. .......... 330/207 A |
| 5,784,017 A | | 7/1998 | Craven ........................ 341/126 |
| 5,815,102 A | | 9/1998 | Melanson .................... 341/143 |
| 5,866,969 A | * | 2/1999 | Shimada et al. ............. 310/318 |
| 5,901,176 A | * | 5/1999 | Lewison ...................... 332/109 |

OTHER PUBLICATIONS

Risbo, Lars, and Hans Anderson,"Conversion of a PCM Signal into a UPWM Signal," International Application No. PCT/DJ97/00133 filed Mar. 26, 1997, International Publication No. WO 97/37433 published Oct. 9, 1997.

Craven, Peter. "Toward the 24–bit DAC: Novel Noise--Shaping Topologies Incorporating Correction for the Non-linearity in a PWM Output Stage," J. Audio Eng. Soc., vol. 41, No. 5, May 1993, pp. 291–313.

\* cited by examiner

*Primary Examiner*—Michael B Shingleton
(74) *Attorney, Agent, or Firm*—Jennifer L. Bales, Esq.; Dan A. Shifrin, Esq.

(57) ABSTRACT

Distortion and noise in high power digital PWM amplifiers is reduced by measuring the difference between the desired output signal and the actual output signal on a pulse by pulse basis. This analog error is converted into a digital signal with an analog to digital converter (ADC). The digital error signal is then used to correct the feedback of the delta sigma modulator in real time. Preferably, more than one moment of the modulator signal is corrected via the feedback. Preferably, the predictable error of the circuitry which is known a priori is also corrected by correcting the delta sigma modulator feedback. A specialized ADC allows the loop delay to be low, without compromising accuracy.

20 Claims, 18 Drawing Sheets

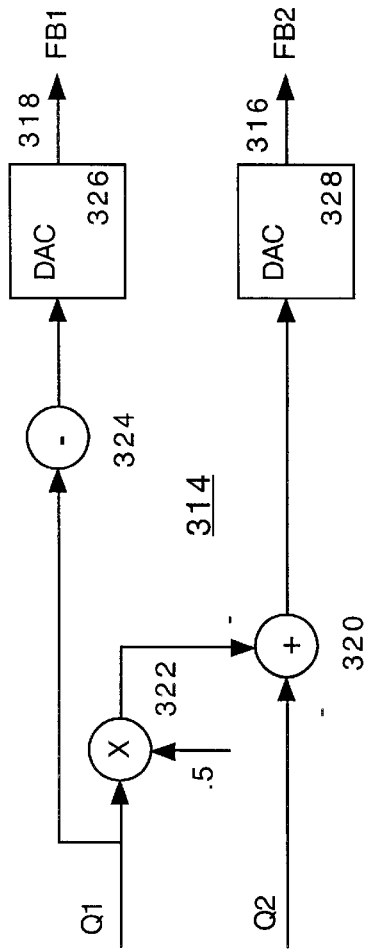
Figure 3b
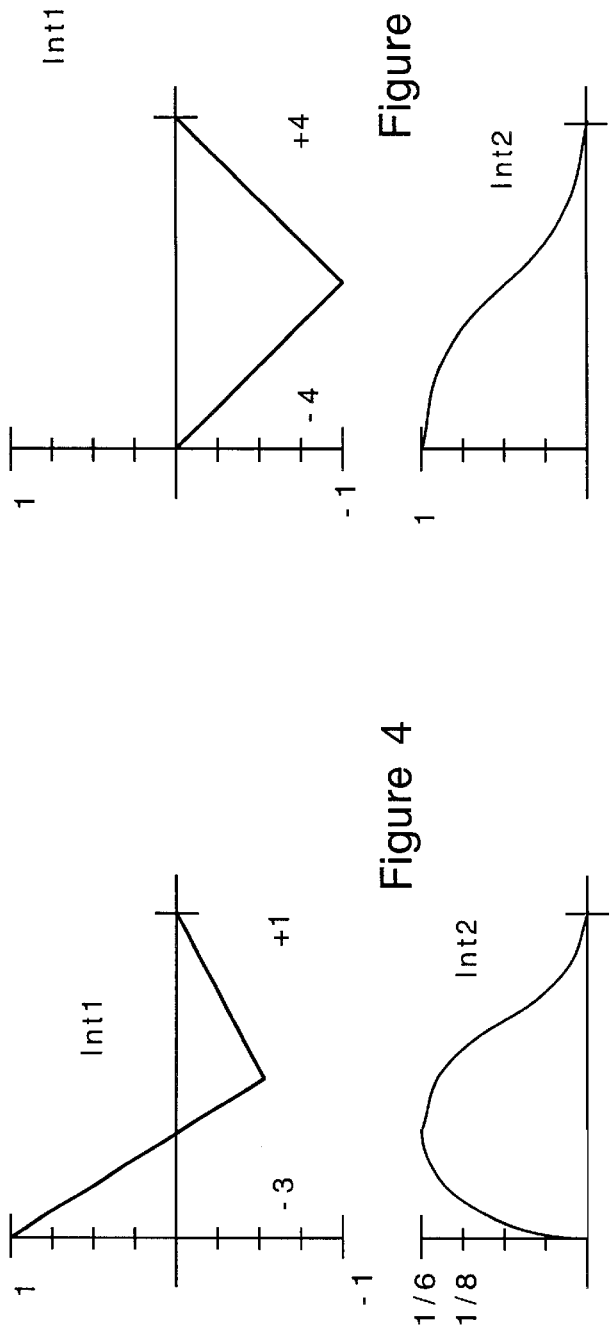
Figure 4
Figure 5

```
(* Copyright AudioLogic 1999  -  AudioLogic Cofidential *)
(* This version JLM 1 May 1999 *)
sdanalyze[ord_, ds_, nz_] :=
  Module[{c0, gg, a, bx, bn, cx, cn, dx, dn, izma, ceq, invm, hnn, hnx, afb, bfb},
  (*
  Analyze a delta sigma topology
  ord - order of modulator
  ds - ds description function
  nz - number of complex zero pairs
  Returns characteristic equation (poles), NTF numerator,  STF numerator,
  state transition matrix for feedback, and b vector for feedback
  *)
co = Table[c[i], {i, ord}]; gg = Table[g[i], {i, nz}];
  (*Define state transition matricies ABCD - x for STF, n for NTF*)
a = Transpose[Table[
  Module[{i = Table[If[j == k, 1, 0], {k, ord}]},
      ds[i, 0, 0, co, gg, 0][[1]]]
  , {j, ord}]];
bx = Module[{i = Table[0, {ord}]}, ds[i, 1, 0, co, gg, 0][[1]]];
bn = Module[{i = Table[0, {ord}]}, ds[i, 0, 1, co, gg, 0][[1]]];
cx = cn = Table[Module[{i = Table[If[j == k, 1, 0], {k, ord}]},
   ds[i, 0, 0, co, gg, 0][[2]]]
   , {j, ord}];
dx = Module[{i = Table[0, {ord}]}, ds[i, 1, 0, co, gg, 0][[2]]];
dn = Module[{i = Table[0, {ord}]}, ds[i, 0, 1, co, gg, 0][[2]]];
(*Print["a=",MatrixForm[a]];*)
Print["bx=", bx, " bn=", bn, " cx=", cx, " dx=", dx, " dn=", dn];
izma = Table[If[j == k, 1, 0], {j, ord}, {k, ord}] - zm*a; (* I- A (z^-1) *)
ceq = Collect[Det[izma], zm]; (* determinate of which is the char. eq. *)
(* Now use nalf of Cramers rule to finish the work *)
hnn = Simplify[dn * ceq + zm * (cn . Table[
         Simplify[Det[Transpose[ReplacePart[Transpose[izma], bn, i]]]], {i, ord}])];
hxn = Simplify[dx * ceq + zm * (cx . Table[
         Simplify[Det[Transpose[ReplacePart[Transpose[izma], bx, i]]]], {i, ord}])];
(*Print["poles= ",ceq,"\nntf zeros= ",hnn,"\nstf zeros= ",hxn];*)
afb = Transpose[Table[
  Module[{i = Table[If[j == k, 1, 0], {k, ord}]},
     ds[i, 0, 0, co, gg, 1][[1]]]
  , {j, ord}]];
bfb = Module[{i = Table[0, {ord}]}, ds[i, 0, -1, co, gg, 0][[1]]];
Print["internal state xform=", MatrixForm[afb], "\nfb coef=", bfb];
{ceq, hnn, hxn, afb, bfb} (* return results *)
];
```

Figure 10a

```
solvecoef[fs_, fc_, n_, ceq_, zeros_] := Module[{lp, pp, ceqc, bnc},
  (*
  Given a denominator polynomial, solve for the coeficients that give
  a butterworth responsed.
  sample freq, corner freq, order, poly in zm, local resonator feedbacks
  *)
  lp[fs1_, fc1_, n1_] := Module[{cp, cp1, pz, r, a1, r1},
  (*
  Make the z transform for a butterworth filter
  fs1 - sample rate
  fc1 - corner frequency
  n1 - order
  *)
  cp1 = Together[(1 - zm * (1 + s1) / (1 - s1)) * (1 - zm * (1 + s2) / (1 - s2)) /.
    {s1 -> r1 * Cos[x] + I * r1 * Sin[x], s2 -> r1 * Cos[x] - I * r1 * Sin[x]}];
  cp = Expand[Numerator[cp1]] / Expand[Denominator[cp1]];
  rp = 1 - zm * (1 + s1) / (1 - s1) /. s1 -> -r1;
  r := N[Tan[fc1 / fs1 * 2 * π / 2]];
  pz := Product[cp /. x -> i π / (2 n1), {i, n1 + 1, 2 n1 - 1, 2}] /. EvenQ[n1];
  pz := Product[cp /. x -> i π / n1, {i, (n1 + 1) / 2, n1 - 1}] * rp /. OddQ[n1];
  N[Collect[pz /. {r1 -> r}, zm]]
  ];
  pp = lp[fs, fc, n];
  ceqc = Flatten[Table[
    Coefficient[ceq /. Table[g[i] -> zeros[[i]], {i, Length[zeros]}], zm^i], {i, n}]];
  bnc = Table[Coefficient[pp, zm^i], {i, n}];
  First[Table[c[i], {i, n}] /. Solve[Inner[Equal, ceqc, bnc, List], Table[c[i], {i, n}]]]
];

makeh[den_, num_, coef_, ze_] := Module[{s1, s2},
  (* Make a rational transfer function given the denominator,
    numerator, coeficents, and zero feedbacks to substitute *)
  s1 = Table[g[i] -> ze[[i]], {i, Length[ze]}];
  s2 = Table[c[i] -> coef[[i]], {i, Length[coef]}];
  Simplify[num /. s1 /. s2] / Simplify[den /. s1 /. s2]
]
```

Figure 10b

```
disprsp[fs_, ntf_, stf_] := Module[{res, ww, sres},
  (* Plot the noise and signal transfer sunctions *)
  res[x_] = ntf /. zm -> x; sres[x_] = stf /. zm -> x;
  Print["Nyquest noise gain = ", res[-1]];
  ww = N[2 * π * I / fs];
  Print["noise power to 20k = ",
    10 * Log[10, NIntegrate[Abs[res[Exp[ww*x]]]^2, {x, 20, 20000}] / (fs / 2)]];
  Show[GraphicsArray[
    {{Plot[20 * Log[10, Abs[res[Exp[ww*x]]]], {x, 0, 25000}, DisplayFunction -> Identity],
     Plot[20 * Log[10, Abs[res[Exp[ww*x]]]], {x, 0, fs / 2},
       PlotRange -> {-20, 20}, GridLines -> Automatic, DisplayFunction -> Identity]},
    {Plot[20 * Log[10, Abs[sres[Exp[ww*x]]]], {x, 0, 25000}, DisplayFunction -> Identity],
     Plot[20 * Log[10, Abs[sres[Exp[ww*x]]]], {x, 0, fs / 2}, DisplayFunction -> Identity]}
    }, ImageSize -> 72 * 8, GraphicsSpacing -> .05, Frame -> True]];
];

(***************************************************
   Tools for delta sigma PWM correction calculation
 ***************************************************)

makecorff[a_, n_, bt_, pat_, ze_] :=
 Module[{ord, nn, mt, mn, md, lft, rght, tot, fxcor, erl,
    cor1, cor2, fcor1, fcor2, s10, f, fj, pFit},
 (*
   Calculate correction coefficients for a ds modulator + pwm - feedforward type
   a - internal state matrix
   n - pwm oversample ratio
   bt - feedback gain values (usually 1 1 1...)
   pat - 0 for right first, centered pattern, 1 for left first
   ze - coeficient values to substitute
 *)
  ord = Length[bt]; nn = N[n];
  mt = a /. Table[g[i] -> ze[[i]], {i, Length[ze]}];
  (*Print["target=",MatrixForm[mt]];*)
  (* Make the 2 nth root of the state transition matrix *)
  mn = Module[{t}, t = Table[If[i == j, 1, 0], {i, ord}, {j, ord}];
     Do[t = t + (mt . Inverse[MatrixPower[t, 2*n-1]] - t) / (2*nn), {25}]; Chop[t]];
  Print["2nth power of mn", MatrixForm[MatrixPower[mn, 2*n]]];
  (*Make the powers of the state matrix, for time slots 0-n-1 *)
  md = Table[MatrixPower[mn, -i], {i, 1-n, n-1, 2}];
Print["powers found"];
  (*Print[MatrixForm[md[[n/2]]]];Print[MatrixForm[md[[n/2+1]]]];*)
  (*assume a grow on right first pattern if pat==0,
    else left first if pat==1, make the pulses, and then sum appropriately*)
  Do[(lft[i] = If[EvenQ[n], n/2 - Floor[(i+pat) /2], (n-1)/2 - Floor[(i-1)/2]];
    rght[i] = lft[i] + i - 1), {i, 1, n}];
  (*Do[Print["lft[",i,"]=",lft[i]],{i,n}];*)
  (*Do[Print["rght[",i,"]=",rght[i]],{i,n}];*)
  Do[tot[j] = Apply[Plus, Take[md, {lft[j] + 1, rght[j] + 1}]], {j, n}];
  tot[0] = Table[0, {ord}, {ord}];
```

Figure 10c

```
Print["tot found"];
  (* now make a list of the effective errors,
   taking the half width pulse as a reference *)
  er1 = Table[(tot[i] - tot[Floor[n/2]] *i/n*2) .bt, {i, 0, n}];
  Print["\nfb coef=", bt];

(*Extract the actual corrections in a form ready to correlate*)
  Do[cor1[j] = Table[{i/nn, er1[[i+1]][[j]]/nn}, {i, 2-Mod[n, 2], nn, 2}], {j, ord}];
  (*Fit the data to polynimoial functions*)
  Do[fcor1[j] = Fit[cor1[j], Table[x^i, {i, 0, 3}], x], {j, ord}];
  (*Do[Print["fcor1[ ",j," ]= ",fcor1[j]],{j,ord}];*)
   (* now for the jitter terms *)
  Do[cor2[j] = Table[{i/nn,
     (er1[[i+1]][[j]]/nn - (fcor1[j] /. x -> i/nn))},
     {i, 1+Mod[n, 2], nn-1, 2}], {j, ord}];
  Do[fcor2[j] = Fit[cor2[j], Table[x^i, {i, 1, 3}], x], {j, ord}];
  (*Do[Print["fcor2=",fcor2[j]],{j,ord}];*)
  (*find the error in the aproximate fit*)
  Do[erfit[j] = Table[
     (er1[[i+1]][[j]]/nn) - (fcor1[j] /. x -> i/nn) - (fcor2[j] /. x -> i/nn)*Mod[n+i, 2]
     {i, 0, nn}], {j, ord}];
  (*Do[ListPlot[erfit[j]],{j,ord}];*)
  Print["Fit error ", Table[Max[Abs[erfit[i]]], {i, ord}]];
(*Make the differences*)
 (* Do[
    fcor1[j]=fcor1[j]-fcor1[j-1];fcor2[j]=fcor2[j]-fcor2[j-1],{j,ord,2,-1}];   *)
(*Extract the meaningful part of the data, and scale.
  The f functions are scaled relative to full scale (input of 0 to 1),
    the fj fuctions relative to one step = full scale/n, (input of 0-1) *)
  Do[f[j] =
    Chop[Table[Coefficient[(fcor1[j] *2 /. x -> (y+1)/2), y^i], {i, 1, 3}]], {j, ord}];
  Do[fj[j] = Chop[Table[Coefficient[fcor2[j], x^i] *nn, {i, 1, 3}]], {j, ord}];
  Print[Table[D[((fcor1[i] + fcor2[i]/2) *2 /. x -> (y+1)/2), y] /. y -> 0, {i, ord}]];
  (*Print["Polynomial Fit",MatrixForm[Table[Flatten[{f[j],fj[j]}],{j,ord}]]];*)
  pFit = Table[Flatten[{f[j], fj[j]}], {j, ord}];
  {er1, pFit}   (*return error table and polynomial fit*)
 ];

(***************************************************
  Delta Sigma PWM real time feedback tools
  ***************************************************)
```

Figure 10d

```
makecorfffb[a_, n_, bt_, ze_, polyord_] :=
 Module[{ord, nn, mt, mn, cortab, poly, erpoly, cof, intmat, intv, intfit, ctpoly, ctcof},
(*
    Calculate correction for a ds modulator- feedforward type - with real time feedback
    a - internal state matrix
    n - pwm oversample ratio
    bt - feedback gain values (usually 1 1 1...)
    ze - coeficient values to substitute Outputs
          [[1]] Fit to polynomials
          [[2]] Fit to cascaded digital integrators
          [[3]] Fit to continous time, cascaded integrators
*)
  ord = Length[bt]; nn = N[n];
  mt = a /. Table[g[i] -> ze[[i]], {i, Length[ze]}];
  (*Print["target=",MatrixForm[mt]];*)
  (* Make the 2 nth root of the state transition matrix *)
  mn = Module[{t}, t = Table[If[i == j, 1, 0], {i, ord}, {j, ord}];
     Do[t = t + (mt . Inverse[MatrixPower[t, 2*n-1]] - t) / (2*nn), {25}]; Chop[t]];
  (*Print["2nth power of mn",MatrixForm[MatrixPower[mn,2*n]]];*)
  (*Make the powers of the state matrix, for time slots 0-n-1 *)
  cortab = Transpose[Table[MatrixPower[mn, -i] . bt, {i, 1-n, n-1, 2}]];
  (*First fit to straight integer polynomials*)
  poly = Table[Module[{t = Table[{j-1, cortab[[i, j]]}, {j, n}]},
     Fit[t, Table[x^i, {i, 0, polyord}], x]], {i, ord}];
  Do[erpoly[j] = Table[
       (cortab[[j, i+1]] - poly[[j]] /. x -> i),
       {i, 0, nn-1}], {j, ord}];
  Print["Poly. fit error ", Table[Max[Abs[erpoly[i]]], {i, ord}]];
  (*Do[ListPlot[erpoly[i]],{i,3,ord}];*)
  cof = Chop[Table[Table[Coefficient[poly[[i]]*x, x^j], {j, 1, polyord+1}], {i, ord}]];
  (* Now fit for cascaded numericintegrators *)
  intmat = Table[If[i >= j, 1, 0], {i, polyord+1}, {j, polyord+1}];
  intv = Transpose[Table[MatrixPower[intmat, n-i] . Table[1, {polyord+1}], {i, n}]];
  (*Print[intv];*)
  intfit =
   Transpose[LinearSolve[Table[intv[[i]] . intv[[j]], {i, polyord+1}, {j, polyord+1}],
      Table[intv[[i]] . cortab[[j]], {i, polyord+1}, {j, ord}]]];
  (*Print[MatrixForm[intfit]];*)
  Do[erpoly[j] = (intfit[[j]] . intv - cortab[[j]]), {j, ord}];
  Print["Integrator fit error ", Table[Max[Abs[erpoly[i]]], {i, ord}]];
  (* Now fit for continous time integrators *)
  ctpoly = Table[Module[{t = Table[{1 + (1 - 2*j) / (2*n), cortab[[i, j]]}, {j, n}]},
     Fit[t, Table[x^i, {i, 0, polyord}], x]], {i, ord}];
  ctcof =
   Chop[Table[Table[Coefficient[ctpoly[[i]]*x, x^j], {j, 1, polyord+1}], {i, ord}]];
  {cof, intfit, ctcof}
 ];
```

Figure 10e

```
(***************************************************
  Define and analyze a target system
  8 th order, all integrators of form 1/(1-z^-1) except
  the third, which is delaying, e.g. z^-1/(1-z^-1).

Three NTF zeros formed by feedback around pairs of
  integrators 3-4 5-6 7-8

Single feedback to first stage, all stages feed forward to
  the quantizer.

This structure has proven very insesitive to simplifications of
  the correction factors, and to coeficient quantization
***************************************************)
```

Figure 10f

```
ds8x[ii_, x_, ns_, co_, g_, fb_] := Module[{i0, i1, i2, i3, i4, i5, i6, i7, y},
  i0 = ii[[1]]; i1 = ii[[2]]; i2 = ii[[3]]; i3 = ii[[4]];
  i4 = ii[[5]]; i5 = ii[[6]]; i6 = ii[[7]]; i7 = ii[[8]];
  y = If[fb == 1, ns, co . ii + ns + x];
  i2 += i1 + i3 * g[[1]];
  i3 += i2;
  i4 += i3 + i5 * g[[2]];
  i5 += i4;
  i6 += i5 + i7 * g[[3]];
  i7 += i6;
  i0 += x - y;
  i1 += i0;
  {{i0, i1, i2, i3, i4, i5, i6, i7}, y}  ];

descx = sdanalyze[8, ds8x, 3];
``` bx={0, 0, 0, 0, 0, 0, 0, 0} bn={-1, -1, 0, 0, 0, 0, 0, 0} cx= {c[1], c[2], c[3], c[4], c[5], c[6], c[7], c[8]} dx=1 dn=1

$$\text{internal state xform} = \begin{pmatrix} 1 & 0 & 0 & 0 & 0 & 0 & 0 & 0 \\ 1 & 1 & 0 & 0 & 0 & 0 & 0 & 0 \\ 0 & 1 & 1 & g[1] & 0 & 0 & 0 & 0 \\ 0 & 1 & 1 & 1+g[1] & 0 & 0 & 0 & 0 \\ 0 & 1 & 1 & 1+g[1] & 1 & g[2] & 0 & 0 \\ 0 & 1 & 1 & 1+g[1] & 1 & 1+g[2] & 0 & 0 \\ 0 & 1 & 1 & 1+g[1] & 1 & 1+g[2] & 1 & g[3] \\ 0 & 1 & 1 & 1+g[1] & 1 & 1+g[2] & 1 & 1+g[3] \end{pmatrix}$$

fb coef={1, 1, 0, 0, 0, 0, 0, 0}

Figure 10g

```
g1 = {-1/32., -5/64., -7/64.};
ctabx = solvecoef[44100*8, 31500, 8, descx[[1]], g1]; Print["coeficients = ", ctabx];

ntfx = makeh[descx[[1]], descx[[2]], ctabx, g1];

stfx = makeh[descx[[1]], descx[[3]], ctabx, g1];

Print["ntfx= ", ntfx, "\nstfx= ", stfx];

disprsp[44100*8, ntfx, stfx];
``` coeficients = {0.946371, 1.70672, 0.926089, 0.369731, 0.137177, 0.0129549, 0.00487844, -0.00221865} ntfx= $(18.6467 (-1 + zm)^2 (1 - 1.96875 zm + zm^2) (1 - 1.92188 zm + zm^2) (1 - 1.89063 zm + zm^2))$ /
  $((3.18243 - 3.54137 zm + zm^2)$
    $(2.5866 - 3.03686 zm + zm^2) (1.83922 - 2.40404 zm + zm^2) (1.23163 - 1.88958 zm + zm^2))$
stfx= 1.

Nyquest noise gain = 4.0859 noise power to 20k = -73.9459

```
x64x = makecorff[descx[[4]], 64, descx[[5]], 0, g1]; Print[MatrixForm[x64x]];
```

$$\text{2nth power of mn}\begin{pmatrix} 1. & 0. & 0. & 0. & 0. & 0. & 0. & 0. \\ 1. & 1. & 0. & 0. & 0. & 0. & 0. & 0. \\ -3.70363\times 10^{-16} & 1. & 1. & -0.03125 & 0. & 0. & 0. & 0. \\ -2.08167\times 10^{-17} & 1. & 1. & 0.96875 & 0. & 0. & 0. & 0. \\ 1.13191\times 10^{-16} & 1. & 1. & 0.96875 & 1. & -0.078125 & 0. & 0. \\ -7.97973\times 10^{-17} & 1. & 1. & 0.96875 & 1. & 0.921875 & 0. & 0. \\ -4.57533\times 10^{-17} & 1. & 1. & 0.96875 & 1. & 0.921875 & 1. & -0.109375 \\ -7.04298\times 10^{-16} & 1. & 1. & 0.96875 & 1. & 0.921875 & 1. & 0.890625 \end{pmatrix}$$

powers found tot found fb coef={1, 1, 0, 0, 0, 0, 0, 0}

Fit error {0., $1.38778\times 10^{-17}$, $7.10959\times 10^{-7}$, $7.10959\times 10^{-7}$, 0.0000205198, 0.0000435498, 0.0000615698, 0.0000777128}

```
bitcorx = makecorfffb[descx[[4]], 32, descx[[5]], g1, 1];
```

```
Print[MatrixForm[bitcorx[[1]]]]; Print[MatrixForm[bitcorx[[2]]]];
Print[MatrixForm[bitcorx[[3]]]];
```

Poly. fit error
{$3.33067 \times 10^{-16}$, $1.66533 \times 10^{-15}$, 0.0759337, 0.082627, 0.0817633, 0.0790469, 0.0763699, 0.0734988}

Integrator fit error
{0., $4.44089 \times 10^{-16}$, 0.0759337, 0.082627, 0.0817633, 0.0790469, 0.0763699, 0.0734988}

$$\begin{pmatrix} 1. & 0 \\ 1.48437 & -0.03125 \\ 0.284985 & -0.0156946 \\ 0.215921 & -0.0112389 \\ 0.179784 & -0.00908536 \\ 0.155275 & -0.00769718 \\ 0.139062 & -0.00680575 \\ 0.125792 & -0.00609479 \end{pmatrix}$$

$$\begin{pmatrix} 1. & 0. \\ 0.484375 & 0.03125 \\ -0.217243 & 0.0156946 \\ -0.143723 & 0.0112389 \\ -0.110948 & 0.00908536 \\ -0.0910346 & 0.00769718 \\ -0.0787221 & 0.00680575 \\ -0.069241 & 0.00609479 \end{pmatrix}$$

$$\begin{pmatrix} 1. & 0 \\ 0.5 & 1. \\ -0.209395 & 0.502228 \\ -0.138104 & 0.359645 \\ -0.106405 & 0.290732 \\ -0.087186 & 0.24631 \\ -0.0753193 & 0.217784 \\ -0.0661936 & 0.195033 \end{pmatrix}$$

Figure 10j

REAL TIME CORRECTION OF A DIGITAL PWM AMPLIFIER

BACKGROUND OF THE INVENTION

FIELD OF INVENTION

The present invention relates to real time correction of digital PWM amplifiers.

DESCRIPTION OF PRIOR ART

It is desirable to produce high quality audio output while directly driving the speaker with a class D output. Class D amplifiers are desirable in audio power amplifiers and the like because they are efficient, and they can handle high power signals. The high efficiency allows for smaller power supplies, and smaller heat sinks. Typically this technique uses a one-bit signal, of two levels, for example +40 Volts and −40 Volts. The one bit signal is filtered through a simple low pass filter and driven into a loudspeaker.

It is further desirable to implement all of the logic to perform the output amplification digitally. Digital logic is inexpensive and dense. A digital input is preferred, because the majority of source signals are digital, in order to take advantage of digital signal processing. One well known technique provides a two level control signal to the Class D drivers via a delta sigma modulator and a pulse wave modulator (PWM). FIG. 1 (prior art) shows a conventional high power digital PWM amplifier. The digital audio input arrives at delta sigma modulator 102, which provides a multilevel noise shaped signal. Modulator 102 feeds PWM 104, which turns the multilevel noise shaped signal into a two level pulse modulated signal. This signal controls drivers 106. Low pass filter 110 removes high frequencies from the output of the switches, and the filtered output 112 drives speakers or other high power load.

The rate at which the output signal switches between levels is typically 200 KHz to 2 MHz for audio applications. The timing of the edges is typically 20 MHz to 200 MHz.

The digital signal is applied to power switches that drive the output filter. In a low power system, these switches can be viewed as equivalent to a high power logic inverter. The fidelity of the switch is nearly perfect. By this it is meant that the rise and fall times are fast, that the on resistance is low relative to the load, and that the off resistance is high. However, in higher power systems, the switch is much less ideal. Time delays, dead time, slew rate, and other characteristics make the switch non-ideal. In addition, the power supply is not perfectly regulated, and not of zero ohm impedance. The imperfections create signal distortion, and increases noise.

References relevant to the present invention include U.S. Pat. No. 5,815,102, by the present inventor, Patent Application Ser. No. 09/510,034, by the present inventor (incorporated herein by reference), "Toward the 24-bit DAC: Novel Noise-Shaping Topologies Incorporating Correction for the Nonlinearity in a PWM OutPut Stage" by Peter Craven, J. Audio Eng. Soc., Vol. 41, No., 5, May 1993, and U.S. Pat. Nos. 5,548,286 and 5,784,017 by Craven. See also WO 97/37433 by L. Risbo et al.

A need remains in the art for apparatus and methods to reduce the distortion and noise in high power digital PWM amplifiers.

SUMMARY OF INVENTION

It is an object of the present invention to provide apparatus and methods to reduce the distortion and noise in high power digital PWM amplifiers.

In order to reduce these effects, the difference between the desired switch signal and the actual switch signal is measured on a pulse by pulse basis. This analog error is converted into a digital signal with an analog to digital converter (ADC). The digital error signal is then used to correct the feedback of the delta sigma modulator in real time. Preferably, more than one moment (integral) of the modulator signal is corrected via the feedback. Preferably, the predictable error of the circuitry (which is known a priori) is also corrected by correcting the delta sigma modulator feedback, for example by using the techniques described in U.S. Pat. No. 5,815,102, by the present inventor.

A specialized ADC according to the present invention allows the loop delay to be low, without compromising accuracy.

BRIEF DESCRIPTION OF THE DRAWINGS

FIG. 2b is a time line showing the error in the output of the driver switches of FIG. 2a.

FIG. 3a is a block diagram of a specialized analog to digital converter (ADC) which is fast and accurate enough to be used in the apparatus of FIG. 2a.

FIG. 3b is a block diagram of an embodiment of the feedback logic of FIG. 3a.

FIGS. 4 and 5 are plots showing the behavior of the integrators of FIG. 3a.

FIGS. 6a and 6b are plots showing two possible feedback patterns in FIG. 3a.

FIG. 7 is a block diagram showing one implementation of apparatus for controlling the loop gains in FIG. 3a.

DETAILED DESCRIPTION OF THE PREFERRED EMBODIMENTS

Figure 1:
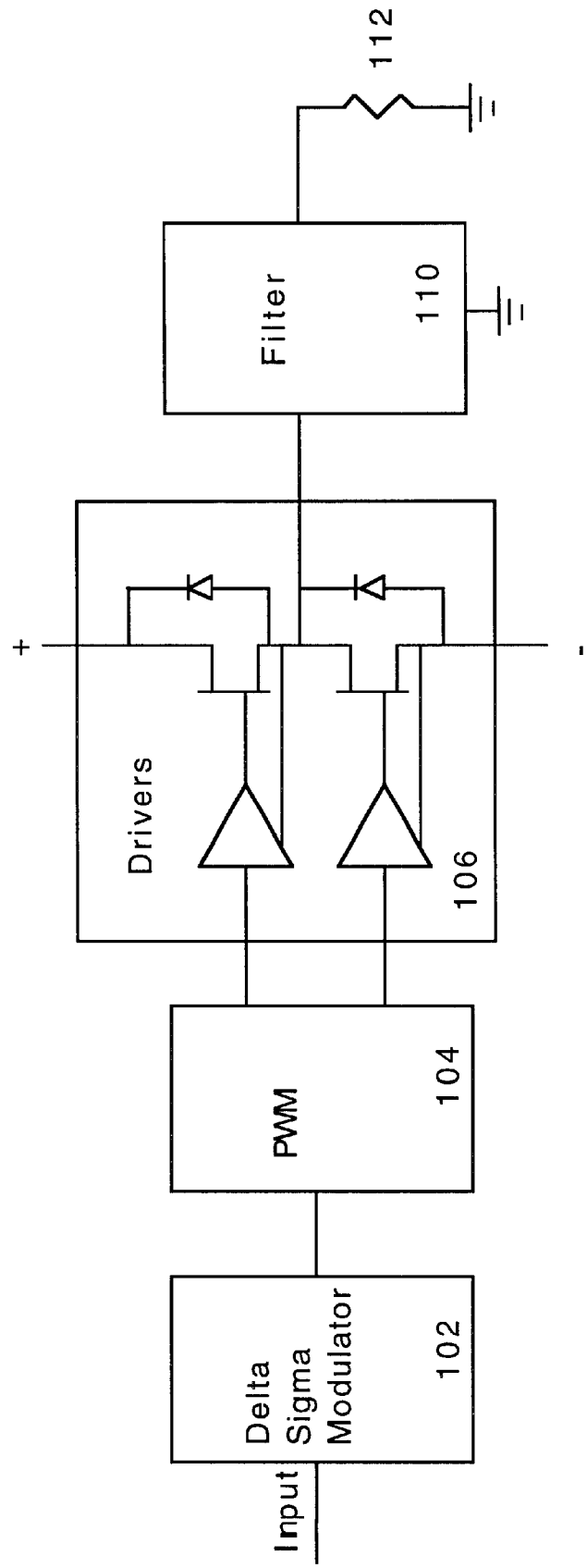
FIG. 1 (prior art) is a block diagram showing a digital PWM amplifier driven by a delta sigma converter.
Figure 2A:
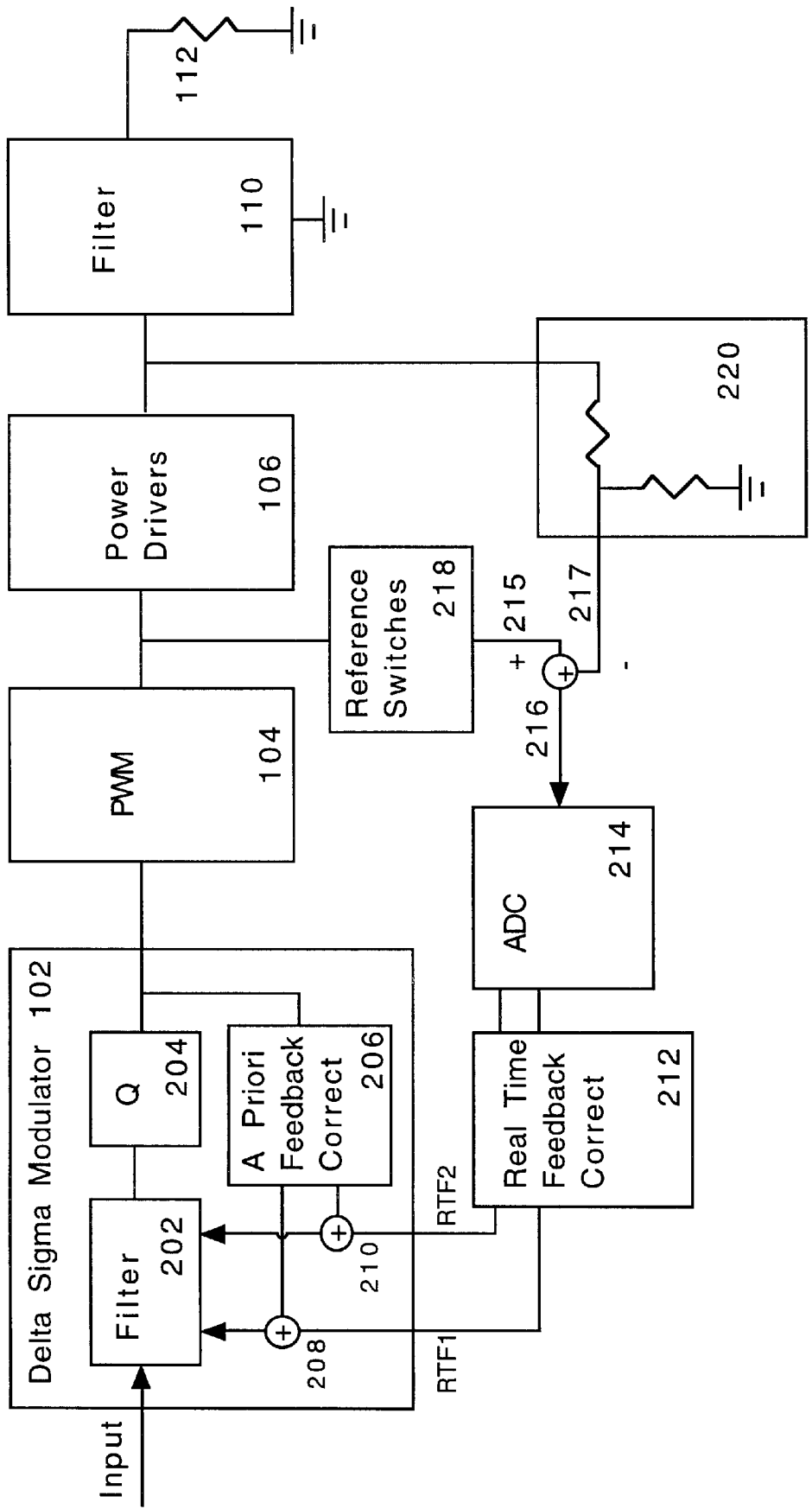
FIG. 2a is a digital PWM amplifier, driven by a delta sigma converter, according to the present invention, wherein the feedback of the delta sigma modulator is corrected to account for amplifier noise and distortion.

FIG. 2a shows a digital PWM amplifier, driven by a delta sigma converter, according to the present invention, wherein the feedback of the delta sigma modulator is corrected to account for amplifier noise and distortion. The apparatus of FIG. 2a is similar to that of FIG. 1, with the addition of real time feedback circuitry.

Figure 9:
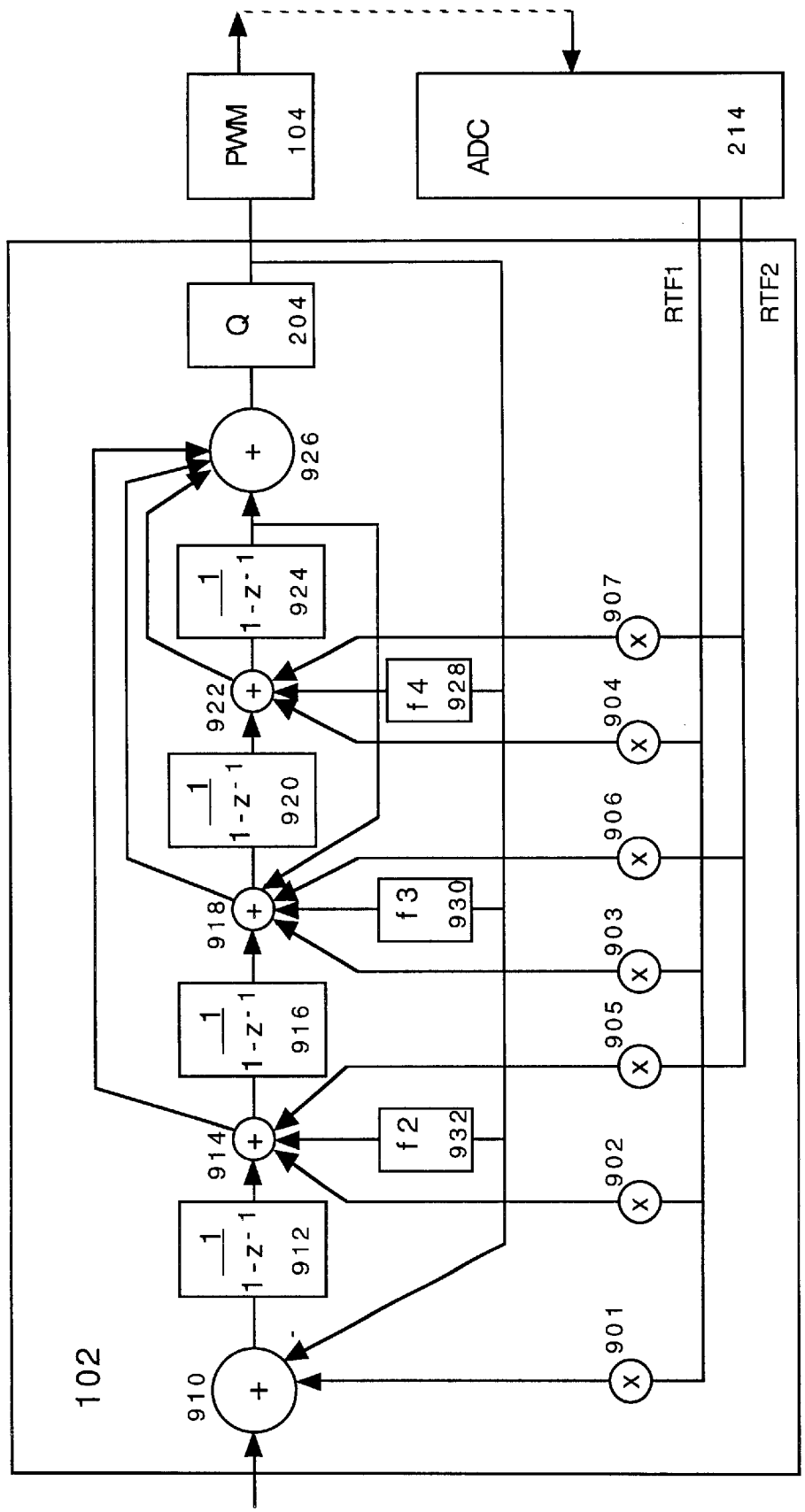
FIG. 9 is a block diagram showing an embodiment of the delta sigma converter of FIG. 2a, wherein both a priori feedback and real time feedback according to the present invention are implemented.

FIG. 2a shows a high level block diagram of the invention. Delta sigma modulator 102 is structured similarly to those known in the state of the art. In the preferred embodiment, it is modified to have multiple correction feedback paths, as described in U.S. Pat. No. 5,815,102, by the present inventor. Filter 202 is a low pass filter (for a high pass noise shaping function). It is typically implemented as a series connected chain of 2–8 integrators (FIG. 9 shows one embodiment of delta sigma modulator 102 in more detail). Quantizer 204 is a multilevel quantizer, with typically 8–256 quantization levels. Correction block 206 corrects for the effects of pulse width modulation, and other systemic, predictable circuit imperfections. A possible design of such a correction block is described in detail in Patent Application Ser. No. 09/510,034, by the present inventor. At least one of the feedback paths to at least one of the integrators is a nonlinear function of the output of quantizer 204. Further feedback path corrections, to higher order stages, may be used as necessary to achieve higher quality. Adders 208 and 210 add in the real time correction factors which are the basis of the present invention.

PWM modulator 104 converts the multilevel signal out of delta sigma modulator 102 to a two level format by varying the duty cycle of the output waveform. This process is well known in the art. For example it is described in detail in works by Craven and by Risbo. See, for example, "Toward the 24-bit DAC: Novel Noise-Shaping Topologies Incorporating Correction for the Nonlinearity in a PWM OutPut Stage" by Peter Craven, J. Audio Eng. Soc., Vol. 41, No., 5, May 1993. See also U.S. Pat. Nos. 5,548,286 and 5,784,017 by Craven. See also WO 97/37433 by L. Risbo et al. In some cases it is desirable to use more than two states of output. For example, four switches and three states can also be employed by driving both sides of the load (in what is known as bridged operation).

Drivers 106 drive low pass filter 110 and thence load 112 (speakers or other high powered load). An example of drivers 106 is shown in FIG. 1. When realized as an actual circuit, the elements of drivers 106, filter 110, and load 112, will all include non-ideal characteristics. For example, the switches of drivers 106 will not operate instantly. The impedance of the power supplies will also be non-zero.

The feedback correction in delta sigma modulator 102, applied by correction block 206, is digital, and the values applied are determined in advance. The prior art references cited above show different ways to correct PWM systems with a priori information. All show different ways to combine noise shaping and pulse width modulation. All assume that the output waveform is exactly known at the time of selection of the output pattern. The feedback correction applied by correction block 206 will be referred to as A Priori Feedback (APF).

Reference switches 218 will operate off of the same logic signal as the output switches of drivers 106, but at a much lower power level. In typical operation, the power stage would operate at tens of volts and several amps, while the reference switch operates at 1–2 volts, and microamps to milliamps. When running at these low power levels, it becomes possible for the reference switches to generate a signal that has virtually no distortion. This signal is assumed to be ideally matched to that assumed in the calculation of the APF.

Attenuator 220 reduces the output signal level 217 to match that of the reference level 215. If attenuated signal 217 matched reference signal 215, it could be assumed that there was no output distortion. If there is a difference, that difference is an indication of the error, caused by drivers 106, which in turn causes noise and distortion. Signal 216 is that difference, or error signal. Error signal 216 is digitized by analog to digital converter (ADC) 214. The digital output of ADC 214 is fed into real time correction block 212, and the resulting correction terms are added to the feedback signals in delta sigma modulator 102 by adders 208 and 210. This feedback will be referred to as Real Time Feedback (RTF).

The combination of the two types of feedback allows the construction of digital power amplifiers with better performance than either one alone allows. The key to good performance is to have most of the correction occur with the APF, and use the RTF to fine tune the final result.

Figure 2B:
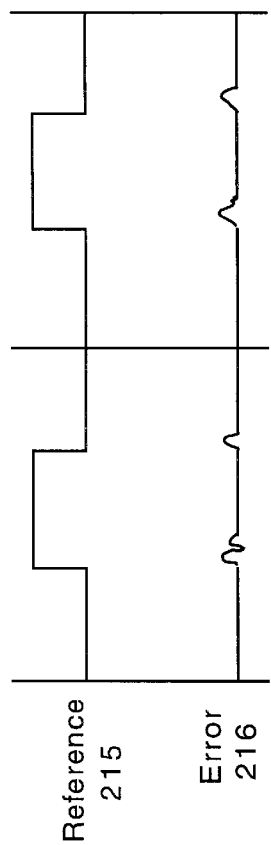

FIG. 2b is a time line showing the error in the output of the driver switches of FIG. 2a. Error signal 216 varies from the zero level notably at switch transition times. The error that occurs at every transition is different and unpredictable, so real time feedback is required.

Figure 3A:
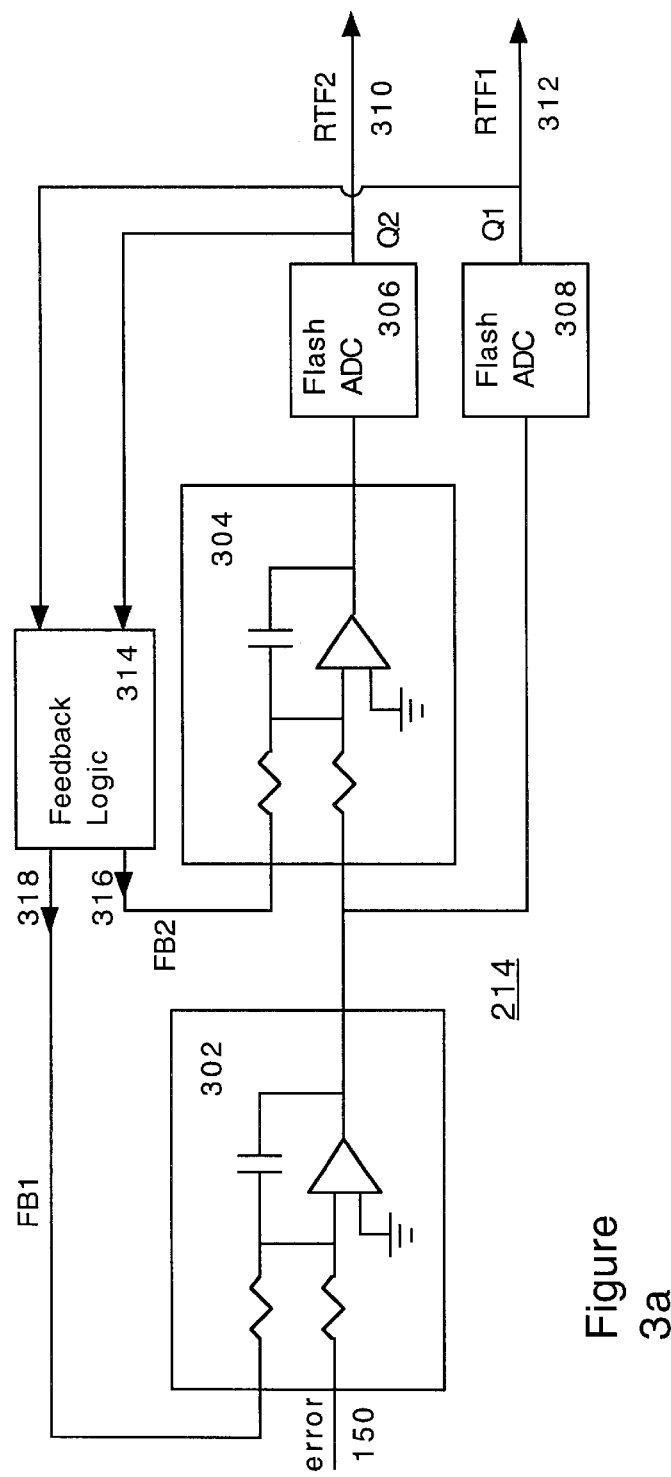

FIG. 3a is a block diagram of a specialized analog to digital converter (ADC) 214 which is fast and accurate enough to be used in the apparatus of FIG. 2a. The design constraints on ADC 214 are severe. If the conversion rate is the modulator rate ($f_m$), an anti-aliasing filter is needed. A low pass filter for use as the anti-aliasing filter would add phase shift and delay, which would make closing the feedback loop impractical. If the conversion rate is $f_h$, (or somewhere near $f_h$) the speed of the conversion is very high, and the required accuracy is also very high. This would make the device unpractical.

In order not to add delay, which would be necessary if a legitimate band limited representation for the signal is desired, the moments of the error signal are converted, and one (or more) moments are fed back. It has been determined that two or three moments are appropriate for class D audio amplification. More moments allow for greater cancellation of the distortion and noise components. Note that the term "moment," as used herein, is equivalent to integral.

The ADC in FIG. 3a is particularly well suited for its described use in the high power DAC of FIG. 2a, but the architecture is also appropriate for use as an ADC filter in other applications. The structure has the advantages of a MASH converter, in that the quantization noise falls off very rapidly with loop order. It avoids the problems that make a continuous time MASH system difficult to construct by solving the sensitivity to component variations.

By means of example, a second order system is shown in FIG. 3a, but the same technique can be extended to a higher order circuit. Integrator 302 is a conventional, continuous time integrator, built out of input resistors, an integration capacitor, and an operational amplifier. It will be assumed, for sake of example, that $R*C=1/f_m$. In real applications the scaling may vary to best suit the voltages and dynamic ranges available. Integrator 304, and any further integrators (for order greater than two), are similarly designed.

ADCs 306 and 308 are high speed, low resolution A/D converters, generally referred to as flash converters. The required resolution is determined by both the desired noise floor of the system, and by the magnitude of the switch error, but will typically be 2–4 bits.

The function of feedback logic block 314 is shown in FIG. 3b, and can be described as follows. The outputs 316, 318 are chosen such that the starting values of all integrators will be reset to 0 at the end of one $f_m$ cycle (assuming that quantizers 306 and 308 added no noise), assuming that the input is 0.

There are many sets of feedback signals that meet this goal.

Two will be described here. A simple technique that leaves the signal constant over the time interval is described first, and then a more advanced technique that applies feedback only with signal 318.

For the first case, set FB1 318 equal to −Q1 (signal 312). Assume that the starting case is [1 0], meaning that the first integrator 302 starts at a voltage of 1, and the second 304 starts at a voltage of 0. At the end of the cycle, the value of the first integrator is 0. This value has been achieved via a linear ramp down over the time tick. The side effect of this ramp is that the second integrator will ramp up to 0.5. That ramp will have the shape of a segment of a parabola. To compensate for this side effect, if FB2 316 is set to −0.5 times Q1, the second integrator will return to zero. After one clock tick, [1 0] will transition to [0 0]. The state [0 1] also needs to be reset, which is simply accomplished by adding the −Q2 value (from signal 306) to the feedback for the second stage.

The following equation "rules" will effect the above principals:

$$FB1=-Q1$$

$$FB2=-Q2-0.5*Q1$$

A possible implementation is shown in FIG. 3b, with the summing done in the digital domain. It is also possible to do the summing after the digital to analog converters (DACs), in the analog domain.

This can easily be extended to higher orders. For the first order case, this design is the same as a continuous time, first order delta sigma modulator. For higher order cases, the design is related to a MASH type of modulator, but with the feedback interactions canceled out. It is desirable to implement such systems in integrated circuits, with on-chip resistors and capacitors. A characteristic of these processes is that the absolute values of the resistor and capacitor are not well controlled. A 50% range in the values is not uncommon. It is necessary to compensate for this variation. Component match (relative accuracy) is very good. FB1 318 is therefore very well matched to the input, and even with an inaccurate trimming in the gain of integrator 302, the feedback will produce an accurate output representation, any residual error being noise shaped. The same does not apply to FB2 316, which is accurate relative to the output of integrator 302, but not necessarily accurate relative to the system input. In the second implementation of feedback block 314, that inaccuracy is compensated.

In order to make the system less sensitive to integrator gain, which is hard to control, all of the feedback can be applied to just the first integrator 302. FB1 318 carries all of the information, and FB2 316 is left at 0, or in effect, disconnected. In order to make this possible, FB1 must vary over the clock cycle. Assume that during the first half of the cycle, FB1 318 is 1, and 0 during the second half. The first integrator will ramp linearly to 0.5 at the midpoint, and stay there. The second integral is the integral (area) of that signal, or ⅜. If instead the signal is 0 for the first half, and 1 for the second half, the first integrator will finish the cycle at 0.5, and the second integrator will finish at ⅛. This defines a controllable system. If the initial state is [1 0], and −3 is applied for the first half cycle, and +1 applied for the second half cycle, the first integrator will ramp from 1 to −0.5 at the mid point, and then back to 0 at the end. The integral of this curve is 0, so the second integrator will remain at 0. This waveforms for the integrators in this case is shown in FIG. 4.

If the initial state is [0 1], the application of −4 for the first half, and +4 for the second half will likewise reset the system. See FIG. 5 for wave shapes. In summary, the desired reset can be obtained by using only FB1, and the following values:

$$FB1=-3*Q1-4*Q2$$

for the first half of the cycle, and $$FB1=Q1+4*Q2$$

for the second half of the cycle.

In a similar fashion, by dividing the cycle time into smaller divisions, higher order systems can be reset. A third order system requires at least 3 time slots, a $4^{th}$ order system at least 4, and so on. This approach can be extended further into a large number of time slots, with as few as 2–3 levels per time slot, and the wave shape for the feedback becoming similar to PWM.

Figure 6A:
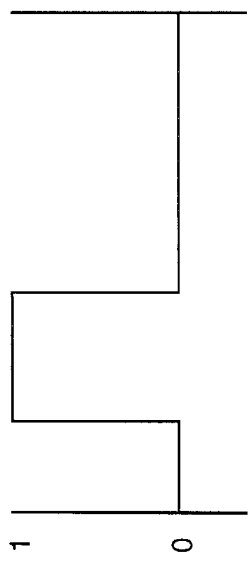
Figure 6B:
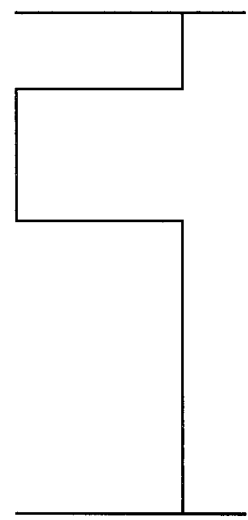

FIGS. 6a and 6b are plots showing two possible feedback patterns in FIG. 3a. Both of these patterns effect the same change to the first integrator, but the first pattern (a), with the energy occurring early in the $f_m$ time slot, has a much greater effect on the second integrator than the feedback pattern of (b). Again, this can be extended to produce feedback for an arbitrary order of integration.

Figure 7:
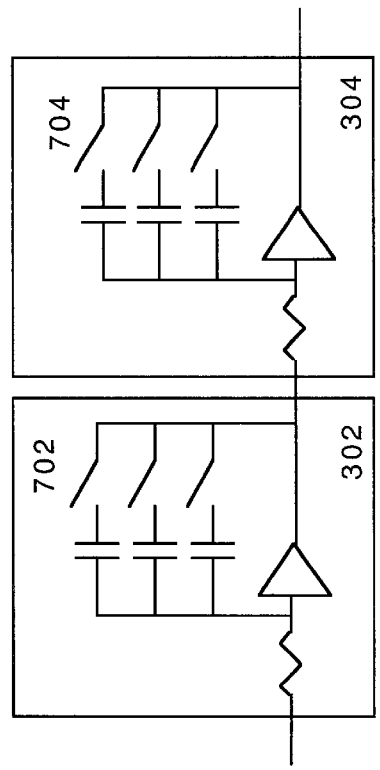

FIG. 7 is a block diagram showing one implementation of apparatus for controlling the integrator gains in FIG. 3a. The gain of integrators 302, 304 is no longer critical, but still must be set to a value such that the loop gain is near unity, or noise performance will suffer. Switches sets 702, 704 are used to select a value of capacitance that most closely gives the desired RC time constant. Depending on the inherent accuracy of the semiconductor process used, and the desired noise performance, typically 2–5 binary weighted trim capacitors would be appropriate. The trimming may also be done with varying the resistors, or by adjusting the gain of the flash ADC in the feedback loop.

Figure 8:
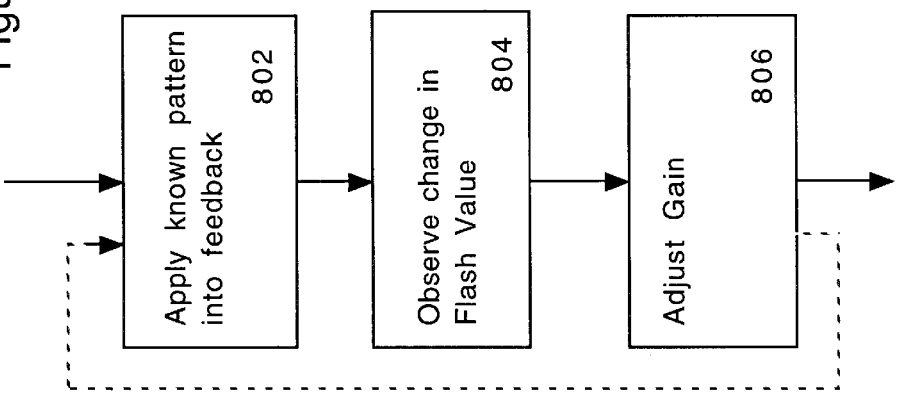
FIG. 8 is a flow diagram showing a method of measuring the gain of the integrators of FIG. 3a at each start up.

FIG. 8 is a flow diagram showing a method of measuring the gain of the integrators of FIG. 3a at start up. The gain of the integrators may be measured at each start up of the system, as illustrated in FIG. 8. At start up, step 802 applies a known pattern into feedback 318 Step 804 measures the change in value at one or both of flash ADCs 306, 308. By observing the changes in the state variables (the integrators), the gain is determined. In step 806, the gain is adjusted. This operation may be iterated until the gain is set as accurately as required. It is also possible to update the gain value continuously by watching the correlation of adjacent feedback terms.

FIG. 9 is a block diagram showing an embodiment of the delta sigma converter of FIG. 2a, wherein both a priori feedback and real time feedback according to the present invention are implemented. The values digitized by ADC 214 must now be applied to the appropriate stages of the loop digital filter, via adders 208, 210. It is preferable to apply these real time corrections in exactly the same manner as correction block 206 would have, if the error had been known a priori.

Typically, loop filter 202 is a series-connected chain of digital integrators. The first digital integrator (in the loop filter) would receive as feedback, the error seen by the first stage of the real time feedback ADC (RTF1, signal 312 in FIG. 3a). The second stage digital integrator would receive a combination of the second and first stage values (RTF1 and RTF2, signals 310 and 312). The further stages (if any, and if further correction is desired) would each receive a different combination of RTF1 and RTF2, signals 310 and 312. In other words, if the feedback is third order or higher, digital integrators 3 and beyond could have some feedback from all of the RTF paths. In practical implementations, it has been found that the correction terms can be ignored past the first 3 or 4 integrators, with little loss of performance.

An example is shown in FIG. 9. The structure is similar to that described in Patent Application Ser. No. 09/510,034, by the present inventor, with added real time feedback terms RTF1 (from the first continuous time integrator 302) and RTF2 (from the second continuous time integrator 304). Gain multiplication 901, 902, 903 and 904 apply RTF1 to the four stages of the integrator (integrators 912, 916, 920, and 924, via adders 910, 914, 918, and 922). Gains 905, 906 and 907 apply RTF2 to all stages past the first (integrators 916, 920, and 924, via adders 914, 918, and 922). Is has been found that gains 904 and 907 can often be assumed to be 0 with no significant loss in performance.

The exact values of gain to be applied to the RTF terms are determined by a technique similar to that used to find the APF terms, as described in Patent Application Ser. No. 09/510,034, by the present inventor. The state transition matrix is defined, and the roots are found. A unit error is applied in all time slots, and a curve is fit using polynomial of order matching the real time feedback system. In other words, if there are two real time feedback terms, a0+a1*t is fit. The outputs of the two ADC stages correspond to a feedback of area and first moment, or "1" and "t". These terms then are the gains 901–907 in FIG. 9.

Figure 10H:
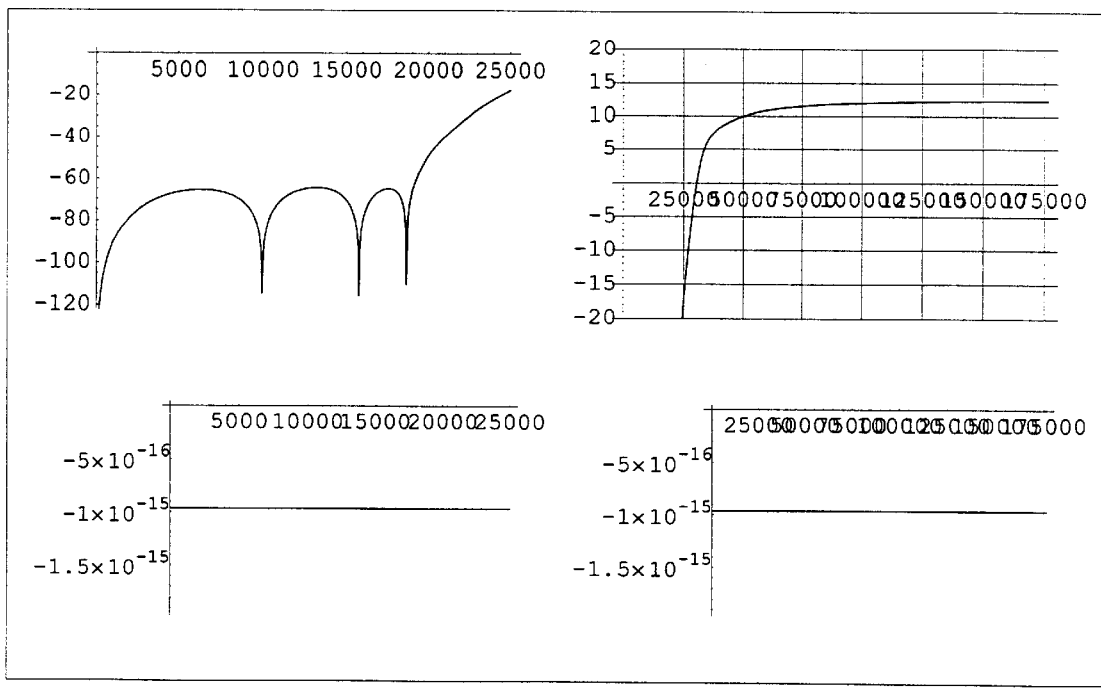
FIG. 10 is an example of a method for computing the real time feedback terms in the apparatus of FIG. 9.

FIG. 10 shows an example of a method for computing the real time feedback gains 901–907 in the apparatus of FIG. 9. This method is identical to the method for computing a prior correction factors described in Patent Application Ser. No. 09/510,034, by the present inventor, incorporated herein by reference. Briefly, the method includes the steps of determining a system equivalent to the modulator, the system operating at a higher clock rate, the higher clock rate being a multiple of the operating clock rate, wherein the output of the system is substantially linear at the higher clock rate, modeling the response to system operation at the higher clock rate, modelling the correction to be applied to each integrator feedback path at the higher clock rate to correct the modelled distortion, computing the correction to be applied within the modulator at the operating clock rate such that the modulator operating at the operating clock rate substantially matches the operation of the system operating at the higher clock rate in response to the same outputs, and implementing the computed correction by applying at least two mutually nonlinear correction functions to the feedback from the quantizer, and adding the respective results to at least two state variables.

The step of computing the correction functions includes the steps of determining the roots of the state transition matrix and computing the mutually nonlinear functions based on the roots.

Those skilled in the art will appreciate that moments can be generated in a number of ways. A second moment can be generated using two continuous time integrators. Or, a second moment can be generated with a single second order continuous time integrator at a high clock rate, combined with two digital integrators. Various other blends of analog and digital circuitry may also be used.

Figure 11A:
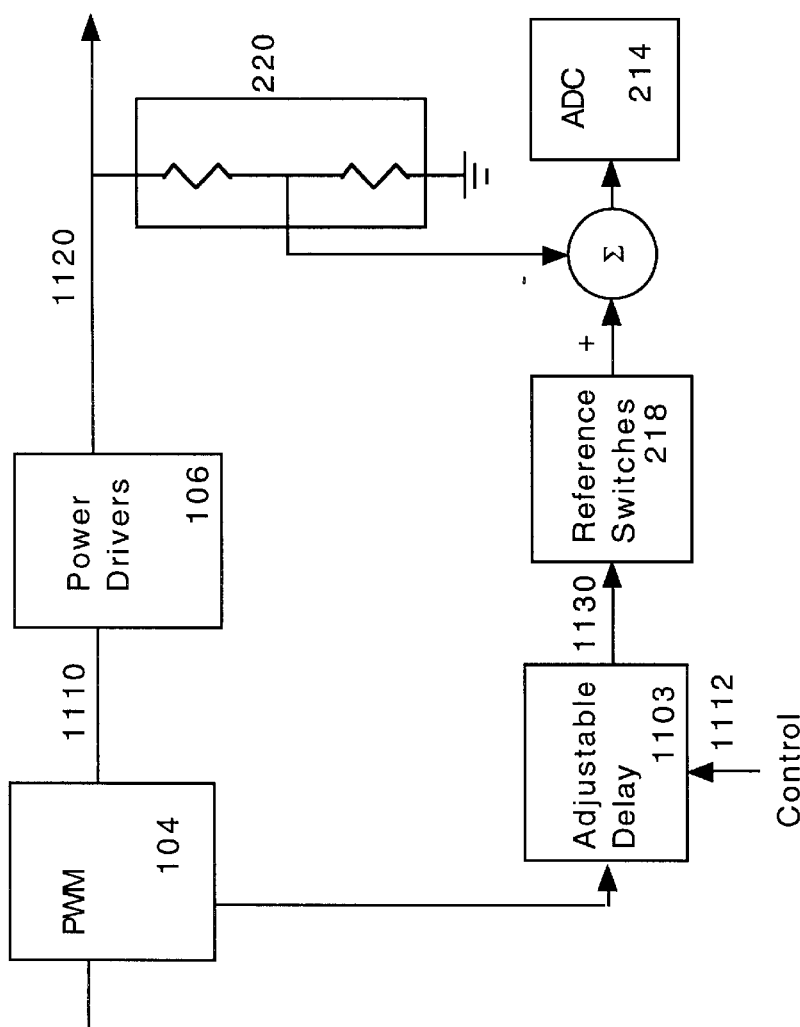
FIG. 11a is block diagram showing a first embodiment of apparatus for measuring and correcting for delays in the real time feedback process of FIG. 2.
Figure 11B:
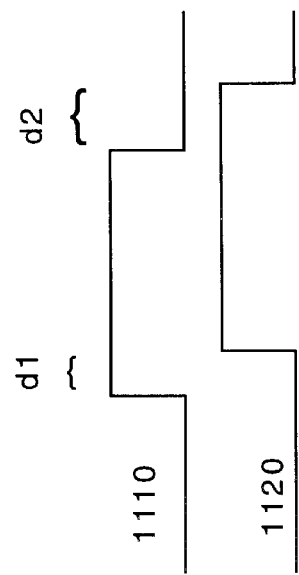
FIG. 11b is a timing diagram showing the input signal to the switches of FIG. 11a and the output signal from the switches.

FIG. 11a is block diagram showing a first embodiment of apparatus for measuring and correcting for delays in the real time feedback process of FIG. 2. The output power switches in a switching amplifier have significant time delay. The delay is largely due to the charge which must be added to or removed from the gates (if FET) of the power devices. These delays are not exactly reproducible from unit to unit, and depend largely on component variations. The reference signal (from 218) will typically have very little delay. The difference in delay will cause a large error signal, and a large part of that error signal is not truly error, only an effect of the delay. It is desirable to match the delay of the reference signal to the actual switches. FIG. 11 shows a technique to measure and then correct for the delays. Signal 1110 is the signal to drive power switches 106, and signal 1120 is the resulting switching waveform. FIG. 11b shows possible relative waveforms of 1110 and 1120. The rising and falling delays are labeled d1 and d2 respectively. In typical power stages, these delays are 20–200 ns. In general, the rise and fall delays differ. This delay increases the noise and distortion of the amplifier, as well as increasing the level of the signal in the real time feedback loop. The delay can be compensated for by (1) measuring the delay, (2) adding a matching delay 1103 to the reference signal, such that the signal 1130 is similar in delay to 1120, and (3) updating the APF correction terms to include the effects of the delay. In FIG. 11a, adjustable delay 1103 is adjusted by signal 1112. Delay 1103 may be implemented in digital or analog logic, and preferably has separate control for rise and fall delay. The analog real time feedback loop can be used to measure the delay. If the area under the curve (integrator 302) is consistently off, then the difference between the rising and falling delay is in need of adjustment (this is caused by an area mismatch). If the area is proper, but the overall delay is wrong, a consistent error will appear in the second real time feedback term. The delay control 1112 can be adjusted to minimize the mismatch between 1120 and 1130.

Figure 12:
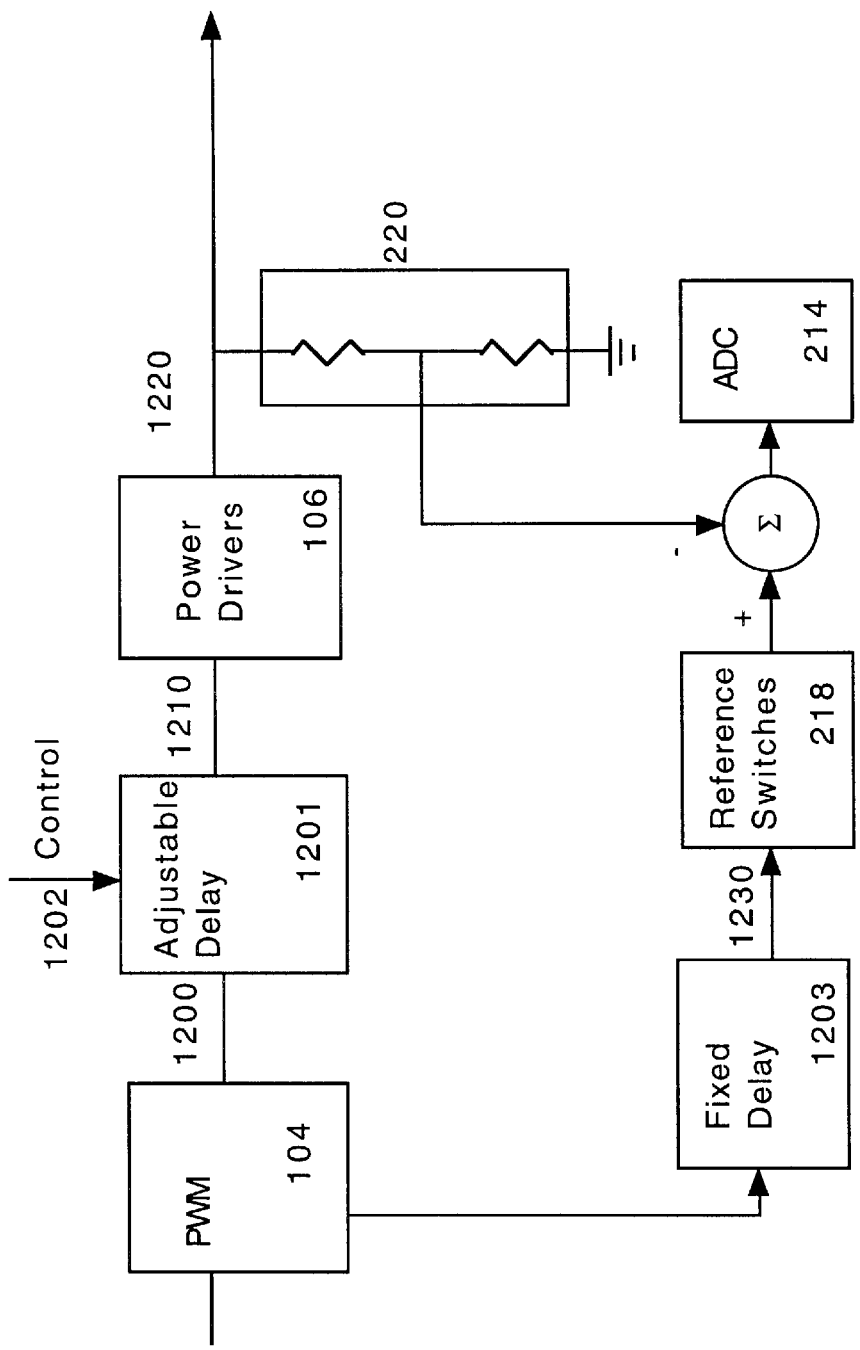
FIG. 12 is block diagram showing a second embodiment of apparatus for measuring and correcting for delays in the real time feedback process of FIG. 2.

FIG. 12 is block diagram showing a second embodiment of apparatus for measuring and correcting for delays in the real time feedback process of FIG. 2. Instead of compensating for the delay, it is also possible to add additional delay to bring all delays to a constant value. This approach is shown in FIG. 12. ADC 214 is again used to measure the actual system delay. The reference signal is delayed by a fixed, standard amount by fixed delay element 1203. The delay is chosen to be larger than the delay seen in the power switches. All of the feedback values in the digital feedback system are calculated assuming that delay amount. The variable delay, 1201, is adjusted via control signal 1202 such that the total delay to the output of the switches is identical to the reference delay. This match is found when the output of the real time feedback ADC is minimal. At this adjustment, the delay from 1200 through the variable delay and the power switches to 1220 is matched with the fixed delay set by 1203. Variable delay 1201 may be the same for all pulse widths, or may change dependent on the desired width. This option is useful in high power system where the pulse fly-back due to the inductor current changes dramatically with output level.

It will be appreciated by one versed in the art that there are many possible variations on this design, but all are typified by real time adjustment of the delta sigma modulator similar to that described above.

What is claimed is:

1. A digital PWM amplifier of the type having a multilevel delta sigma modulator of at least second order, having at least two state variables feeding a quantizer which provides feedback to the state variables and an output signal driving a PWM, the PWM feeding Class D output stage drivers, wherein the improvement comprises:

means for comparing the output of the PWM with the output of the drivers, and generating an analog error signal based upon the comparison;

an analog to digital converter (ADC) for converting the analog error signal into a digital error signal; and real time correction means for correcting the feedback of the delta sigma modulator on an ongoing basis based upon the digital error signal.

2. The apparatus of claim 1, wherein the ADC generates a first and a second digital error signal corresponding to a first and a second integral of the analog error signal, and wherein feedbacks to different state variables of the delta sigma modulator are corrected differently according to the first and second digital error signals.

3. The apparatus of claim 2, further including a priori correction means for applying different correction factors based upon predictable errors to the state variables.

4. The apparatus of claim 2, wherein the ADC comprises:
   at least two integrators in series;
   feedback logic for generating feedback signals based upon the digital error signals;
   the first integrator fed by the analog error signal and a first feedback signal from the feedback logic;
   the second integrator fed by the output of the first integrator and a second feedback signal from the feedback logic; and
   two flash ADCs each having an output of one the integrators as its analog input and providing one of the digital error signals as its digital output.

5. The apparatus of claim 4, wherein the feedback logic comprises:
   means for generating a first feedback signal based on the negative of the first digital error signal; and
   means for generating a second feedback signal based on the negative of the second digital error signal combined with a fraction of the negative of the first digital error signal.

6. The apparatus of claim 4, further including means for measuring a gain of each of the integrators.

7. The apparatus of claim 6, further including means for adjusting a gain of each of the integrators.

8. The apparatus of claim 2, further including means for measuring and compensating for a relative delay between the output of the PWM and the output of the drivers.

9. The apparatus of claim 8, wherein the measuring and compensating means comprises adjustable delay means connected between the PWM and the comparing means.

10. The apparatus of claim 8, wherein the measuring and compensating means comprises fixed delay means connected between the PWM and the comparing means and adjustable delay means connected between the PWM and the drivers.

11. A method for improving the performance of a digital PWM amplifier of the type having a multilevel delta sigma modulator of at least second order, having at least two state variables feeding a quantizer which provides feedback to the state variables and an output signal driving a PWM, the PWM feeding Class D output stage drivers, wherein the method comprises the steps of:
   comparing the output of the PWM with the output of the drivers, and generating an analog error signal based upon the comparison;
   converting the analog error signal into a digital error signal; and
   correcting the feedback of the delta sigma modulator on an ongoing basis based upon the digital error signal.

12. The method of claim 11, further including the steps of:
   generating a first and a second digital error signal corresponding to a first and a second integral of the analog error signal, and
   correcting feedbacks to different state variables of the delta sigma modulator differently according to the first and second digital error signals.

13. The method of claim 12, further including a method for deriving correction functions for application by the correcting feedbacks step comprising the steps of:
   determining a system equivalent to the delta sigma modulator, the equivalent system operating at a higher clock rate, the higher clock rate being a multiple of the operating clock rate, wherein the output of the system is substantially linear at the higher clock rate;
   modeling the response to system operation at the higher clock rate;
   modelling the correction to be applied to each integrator feedback path at the higher clock rate to correct modelled distortion;
   computing the correction functions to be applied within the modulator at the operating clock rate such that the modulator operating at the operating clock rate substantially matches the operation of the system operating at the higher clock rate in response to the same outputs.

14. The method of claim 13, wherein the step of computing the correction includes the steps of determining the roots of the state transition matrix and computing the correction functions based on the roots.

15. The method of claim 12, further including a priori correction step of applying different correction factors to feedbacks to different state variables based upon predictable errors to the state variables.

16. The apparatus of claim 12, wherein the step of converting the analog error signal into digital error signals comprises:
   (a) generating feedback signals based upon the digital error signals;
   (b) finding the integral of the analog error signal and a first feedback signal;
   (c) finding the integral of the integral generated in step (b) and a second feedback signal; and
   (d) converting the integrals into digital error signals.

17. The method of claim 16, wherein the feedback generating step comprises:
   generating a first feedback signal based on the negative of the first digital error signal; and
   generating a second feedback signal based on the negative of the second digital error signal combined with a fraction of the negative of the first digital error signal.

18. The method of claim 16, further including the step of measuring a gain of each of the integral generating steps.

19. The method of claim 18, further including the step of adjusting gain of each of the integral generating steps.

20. The method of claim 11, further including the steps of measuring and compensating for a relative delay between the output of the PWM and the output of the drivers.

* * * * *